United States Patent
Li

(10) Patent No.: US 9,029,693 B2
(45) Date of Patent: May 12, 2015

(54) FLEXIBLE SOLAR CELL PHOTOVOLTAIC ASSEMBLY PREPARED WITH FLEXIBLE SUBSTRATE

(75) Inventor: Yi Li, Shenzhen (CN)

(73) Assignee: Shenzhen Trony Science & Technology Development Co., Ltd., Shenzhen (CN)

( * ) Notice: Subject to any disclaimer, the term of this patent is extended or adjusted under 35 U.S.C. 154(b) by 0 days.

(21) Appl. No.: 14/357,432

(22) PCT Filed: Feb. 20, 2012

(86) PCT No.: PCT/CN2012/000195
§ 371 (c)(1),
(2), (4) Date: May 9, 2014

(87) PCT Pub. No.: WO2013/075386
PCT Pub. Date: May 30, 2013

(65) Prior Publication Data
US 2014/0261681 A1 Sep. 18, 2014

(30) Foreign Application Priority Data
Nov. 24, 2011 (CN) .......................... 2011 1 0378423

(51) Int. Cl.
*H01L 31/00* (2006.01)
*H01L 31/18* (2006.01)
*H01L 31/0224* (2006.01)
*H01L 31/048* (2014.01)
*H01L 31/0392* (2006.01)
*H01L 31/0203* (2014.01)

(52) U.S. Cl.
CPC .... *H01L 31/022475* (2013.01); *H01L 31/1804* (2013.01); *H01L 31/1876* (2013.01); *Y02E 10/50* (2013.01); *H01L 31/048* (2013.01); *H01L 31/03926* (2013.01); *H01L 31/0203* (2013.01)

(58) Field of Classification Search
CPC . H01L 31/042; H01L 31/048; H01L 31/0487; H01L 31/075
USPC .................................. 136/244, 251, 256, 261
See application file for complete search history.

(56) References Cited

U.S. PATENT DOCUMENTS

| 2010/0065116 A1* | 3/2010 | Stancel et al. | 136/256 |
| 2011/0253189 A1* | 10/2011 | Shimosawa et al. | 136/244 |
| 2012/0017988 A1* | 1/2012 | Moslehi | 136/259 |

FOREIGN PATENT DOCUMENTS

| CN | 101162742 A | | 4/2008 |
| CN | 101232055 | * | 7/2008 |
| CN | 101232055 A | | 7/2008 |
| JP | 2009059772 A | | 3/2009 |

* cited by examiner

*Primary Examiner* — Matthew Martin
(74) *Attorney, Agent, or Firm* — Anova Law Group, PLLC

(57) ABSTRACT

This invention is directed to a flexible solar cell photovoltaic module with high light transmittance based on modified substrate, which belongs to the field of thin-film solar cell technology. The objective of the present invention to provide a technical solution for a transparent flexible solar cell module and its fabrication method. Technical features include using a stainless steel template to mold a modified polyimide PI substrate (the PI substrate). The PI substrate has light-passing through-holes, including draining holes and convergence holes, through and distributed on the PI substrate, a conductive film layer, and various stacked photoelectric conversion film layers. The creativeness of the present invention is obvious, such as reducing the short circuit and current leakage due to crystallization of the photoelectric layer interface caused by a subsequent process of laser etching the conductive film layer, reducing the composition on the surface of the solar cell, reducing steps of the fabrication process, and lowering the production cost. Further, the present invention significantly increases the conversion efficiency and load capacity of the solar cell and the quality-cost ratio. The transparent flexible solar cell photovoltaic module also has a broad range of applications.

16 Claims, 2 Drawing Sheets

FLEXIBLE SOLAR CELL PHOTOVOLTAIC ASSEMBLY PREPARED WITH FLEXIBLE SUBSTRATE

FIELD OF THE INVENTION

The present invention generally relates to thin film solar cell technologies and, more particularly, to solar cell photovoltaic modules with high light-transmittance made based on modified substrates.

BACKGROUND

Currently, commercial solar photovoltaic (PV) modules are divided into two categories, one is the bulk crystalline silicon solar cells and polycrystalline silicon solar cells, etc., and the other is thin-film solar cells, such as silicon series, copper indium gallium selenide series, and cadmium telluride series, etc., solar cells. Further, based on the type of the substrate used, thin-film solar cells can be divided into hard substrate solar cells and flexible substrate solar cells.

Thin-film solar cells currently on the market are mainly based on glass substrates, which belong to the hard substrate solar cell category. Such solar cells currently have the largest market share. The flexible substrate solar cells have less share of the solar cell market. The flexible substrates used in the solar cells include conductive materials, such as stainless steel strip and copper strip, etc., and insulation materials, such as polyimide.

U.S. Pat. No. 6,858,461 and U.S. Pat. No. 4,795,500 respectively disclose solar photovoltaic modules with different light transmittances made on a transparent TCO glass substrate using a laser to etch the light absorbing layer and the back metal-electrode-layer film. Based on the above U.S. Patents, Japanese Patent JP2003003956 and Chinese patent CN200480001786.3 realize ordered control on the size of openings (diameter 30~500 μm), opening spacing (1.01 to 2 times the diameter), and lattice by controlling the on-off frequency of the laser and the relative scanning speed of the laser between the laser and the substrate. These patents have the common feature of using laser to etch the light-absorbing layer and the back metal-electrode-layer film to achieve light transmittance. However, its drawback is that the high-energy plasma generated by laser etching can melt the back metal and directly cause short circuit between the front electrode and the back electrode on the surfaces of the etching area, and crystallization of particles of amorphous silicon. This can increase the leakage current, decrease the fill factor, and thus destroy the battery performance.

Chinese Patent 200710073014.6 discloses a flexible solar cell based on modified polyimide substrate. The polyimide film is light-weighted, low cost, and completely transparent after modification, with a light transmittance rate of 93%, and the photoelectric conversion efficiency is improved. However, the convergence techniques, such as affinity between the solar cell substrate and the packaging material, still needs to be improved to increase the light transmittance, to reduce product cost, and to meet the various requirements of the market, especially in the green photovoltaic building field.

CONTENTS OF THE INVENTION

As above mentioned, the objective of the present invention is to provide a technical solution for a flexible or flexible solar cell and its fabrication method. According to the present invention, a stainless steel template is utilized as a molding template to form the modified polyimide PI substrate (simply referred as PI substrate). The template has light-passing through-holes, including one or more current-guide holes (or simply draining holes) and one or more convergence holes, distributed within the front electrode pattern of the stainless steel template. The PI substrate also has light-passing through-holes including draining holes, convergence holes, etc., passing through the PI substrate and distributed in various stacked films deposited on the surface of the PI substrate, such as the deposited conductive film and the photoelectric conversion layer. The light-passing through-holes can be pre-fabricated, i.e., can be simultaneously formed in the PI substrate. The pre-fabricated through holes reduce the short circuit and current leakage due to crystallization of the photoelectric layer interface caused by a subsequent process of laser etching the conductive film layer, reducing steps of the fabrication process and the production cost.

Another objective of the present invention is to use the characteristics of the flexible solar cell, such as capable of being bent arbitrarily, capable of being changed to many shapes, capable of adjusting the light-passing through-holes, and easy to be packaged, to make transparent flexible solar cell photovoltaic modules and solar cell photovoltaic building modules that are wind-resistant, aesthetic, and of compliance with building standards, which can be integrated into the green and energy-saving BIPV (building-integrated photovoltaics) photovoltaic buildings.

The present invention, considering both the technical issues raised above and the objectives to be implemented, provides following technical solutions: using polyimide substrate to fabricate flexible thin-film solar cells and packaged modules/assemblies/components, including single-junction or multiple-junction silicon series flexible thin-film solar cells chips (hereinafter referred as solar cell chips or chips). According to the industry traditions, usually unpackaged solar cells are referred as solar cell chips or just chips, and packaged solar cells are referred as solar cell modules (assemblies or components).

Technical features of flexible solar cells according to the present invention include using fully-transparent, with a light transmittance of 90%-95%, modified polyimide PI as substrates. The PI substrate has through-holes distributed in the front electrode pattern region, including current-guide holes (or simply draining holes) and convergence holes, which are patterns duplicated from the stainless steel template (or simply template) with a thickness of 0.45 mm to 0.65 mm and are one-to-one corresponding to the through-holes distributed in the front electrode pattern region of the template. The through-holes are through and distributed in the transparent conductive TCO (transparent conductive oxides) film and various PIN-type silicon-based film layers, forming transparent flexible solar cell chip with light transmittance patterns. The chip is placed between a transparent front plate and a transparent rear plate, with affinity between thereof, and packaged into a transparent solar cell module or solar cell photovoltaic construction assembly by laminating pressing or a high-pressure autoclave. Flexible or soft packaging requires that the transparent front plate material and the rear plate material are flexible polymer materials. If rigid transparent BIPV photovoltaic module is used, the front plate and the rear plate are transparent glass material or at least one of the transparent front plate material and the rear plate material is rigid. The transparent front plate material, adhesive, solar cell chip, adhesive, and the rear plate material are hot-press packaged in a laminating pressing machine or a high-pressure autoclave.

The flexible solar cell or solar cell chip, including a single junction amorphous silicon thin film solar cell, uses flexible and transparent PI substrate and sequentially deposits on the transparent conductive film TCO layer: P-type amorphous silicon $P^+$ a-Si, intrinsic amorphous silicon I a-Si, N-type amorphous silicon $N^+$ a-Si, and Al metal film, etc. The solar cell can be a multiple-junction solar cell, including double junctions or triple junctions stacked layer solar cell, which can be homojunction or heterojunction. For example, a double junction heterojunction solar cell includes: a transparent modified polyimide PI substrate, and various thin film layers sequentially deposited on the substrate: a composite transparent conductive film TCO layer, P-type amorphous silicon $P^+$ a-Si, intrinsic amorphous silicon I a-Si, N-type microcrystalline silicon, P-type microcrystalline silicon, intrinsic amorphous silicon I a-Si, N-type amorphous silicon $N^+$ a-Si, and Al metal film, etc.

The stainless steel sheet template can be a stainless steel sheet or strip of a thickness of 0.45 mm to 0.65 mm. The template is configured with through-holes distributed within the front electrode pattern region and/or distribution pattern region, including current-guide holes and convergence holes. A PI substrate can be fabricated by screen printing or spraying on the stainless steel template and, after heating and curing, the PI substrate has patterns and light-passing through-holes corresponding to those of the stainless steel template. The formed transparent solar cell photovoltaic assembly also includes soldered lead wire, installed wiring boxes, and filled sealant.

According to the present invention, different from current technologies, the flexible solar cell photovoltaic module is fabricated with a flexible substrate.

The current technologies do not have the solution for flexible solar cell PI substrate, using the stainless steel template to simultaneously form light-passing through-holes including drainage holes and convergence holes, through and distributed in the modified PI substrate, the TCO transparent conductive film, the PIN stacked layer, and the metal layer. Thus, the fabrication process can be optimized, the process steps can be simplified, and working hours can be reduced. The performance degradation, such as micro short-circuit and current leakage due to crystallization of the photoelectric layer interface caused by laser etching the TCO transparent conductive film, can be avoided.

According to the present invention, a method for making the flexible solar cell photovoltaic module using a flexible substrate includes preparing the modified polymer PI substrate and directly obtaining silicon series thin film solar cells and assembly package. A transparent modified polyimide substrate can be prepared according to a particular molar ratio. First, polyamic acid slurry is prepared. After vacuum filtration, the polyamic acid slurry is screen printed or sprayed onto the stainless steel template sheet or strip and processed at high temperature 350° C. After being cooled, the PI substrate is removed from the stainless steel template to form the transparent modified polyimide PI substrate, with light-passing through-holes including drainage holes and convergence holes, through and distributed in the modified PI substrate, the transparent conductive film, and various photovoltaic conversion thin film layers.

By a single molding using the stainless steel template, the transparent modified polyimide PI substrate can be made. Further, on top of the transparent conductive film of the PI substrate, at least one sequentially stacked P-type amorphous silicon film layer, I intrinsic amorphous silicon layer, N-type amorphous silicon film layer, and the metal layer can be formed to form the solar cell chip. After the solar cell chip is fabricated, it is packaged using polymer materials and a packaging layer into a transparent flexible solar cell photovoltaic module or photovoltaic building component.

According to the principles and concepts of the present invention, a stainless steel template is first selected: top solar cell patterns are designed on the stainless steel template with a thickness of 0.45 mm to 0.65 mm. The modified polyamic slurry is screen printed or sprayed on the stainless steel template and is baked dry at temperature of approximately 350° C. After being cooled and removed from the stainless steel template, a fully transparent PI substrate with a light transmittance of approximately 95% is formed. Because the drainage holes and convergence holes on the transparent conductive film are light-passing through-holes, when making ZnO or $SnO_2$ or ITO transparent conductive film by magnetron sputtering on both sides of the PI substrate, no film is formed within the range of all of the light-passing holes.

According to the present invention, flexible amorphous silicon solar cells with single junction, double junction, or triple junction, etc., can be made based on the above transparent modified polyimide PI substrate. Using the double-junction solar cell chip as an example, in a vacuum chamber at a deposition temperature of approximately 250° C., depositing amorphous silicon thin film layers: the P-type of the top cell by approximately 120 Å, the I-type film layer of the top cell by approximately 910 Å; at a temperature of approximately 400° C., depositing the N-type film of the top cell by approximately 250 Å and the P-type microcrystalline silicon thin film layer of the bottom cell by approximately 250 Å to form the tunnel junction; and, at a temperature of approximately 400° C., depositing the I-type film of the bottom cell by approximately 3500 Å and the N-type film layer of the bottom cell by approximately 250 Å to form the flexible double-junction solar cell chip. After packaging, the solar cell photovoltaic module or the BIPV photovoltaic building integrated component can be made. The packaging process is: the double-junction solar cell chip is placed between organic or inorganic material of the transparent front plate and the transparent rear plate and packaged into a transparent flexible solar cell photovoltaic assembly or module by laminating pressing or a high-pressure autoclave. The hot-pressed transparent flexible assembly can then be cut, and its lead wires are soldered on the wire outlets, wiring boxes are installed, and sealant is filled.

The differences from the conventional flexible amorphous silicon solar cells based on non-transparent PI substrate may include a different sequence for forming stacked thin films of the solar cell. According to the present invention, the single junction or multiple junctions are PIN thin film layers sequentially formed on the substrate, while the conventional solar cells use NIP thin film layers. For the microscopic structure of the thin film solar cell, different processes may directly affect the photoelectric conversion efficiency of the product.

According to the present invention, on the PI substrate, the P layer is first deposited, and then I layer is deposited. The principle is simply to improve performance of the intrinsic I layer. Usually, the I intrinsic layer's amorphous silicon I a-Si appears a weak N-type, first depositing the P-type amorphous silicon $P^+$ a-Si can improve the photosensitive characteristics of the I intrinsic layer of amorphous silicon a-Si, thereby enhancing the conversion efficiency of the solar cell. Further, according to the present invention, a transparent modified polyimide PI substrate is used to create heterojunction solar cells, also having the advantage of desired light transmittance of the top cell, and reducing the overall loss on the surface of the solar cell.

With the conventional technologies, opaque PI substrates and NIP cell structure are often used. Amorphous silicon films must be deposited on the PI substrate, and the TCO film is deposited later, resulting in the deposition temperature of the TCO film, 350° C.-400° C., being greater than the deposition temperature of the amorphous silicon film, 220° C.-250° C. Thus, the previously deposited amorphous silicon film, at high temperature of 350° C.-400° C., may incur a large amount of high-temperature hydrogen release phenomenon. This may result in a large number of micro-voids in the amorphous silicon film, reducing the performance of the amorphous silicon substantially. The performance of the solar cell is also subsequently decreased, which ultimately may affect the conversion efficiency and load capacity of the solar cell. On the other hand, according the present invention, the fabrication process first deposits the TCO film. Thus, the TCO film can be deposited at the desired temperature of 350° C.-400° C., resulting TCO films with desired light transmittance and surface resistance.

Thus, the advantages of the present invention include breaking the tradition and adjusting the fabrication process structure, so as to increase the deposition temperature, to find basis to avoid a large amount of hydrogen release by the amorphous silicon film at high temperatures, and to prevent the impurity diffusion of the (P, I) and (I, N) interface at high temperatures and performance decay to the I layer.

According to the present invention, a technical solution for making flexible solar cell photovoltaic modules using flexible substrates is provided. Different from conventional technologies, the fabrication method may include the followings.

1) First, a stainless steel template is provided. The template has light-passing through-holes distributed in the conductive pattern region on the template, including current-guide holes and convergence holes, such that the material and modified PI substrate can be molded in a single process.

2) The modified polyimide PI substrate is fabricated: the light-passing through-holes on the substrate and their functions are the same as those on the stainless steel template.

3) The transparent substrate is put on a frame, such that composite TCO conductive films can be formed on both sides of the modified PI substrate simultaneously by magnetron sputtering.

4) Preheating: the transparent substrate is mounted on a deposition holder and preheated at a temperature of 220° C.-250° C. for 1.5-2 hours.

5) Deposition: in a vacuum chamber, at the temperature of 220° C.-250° C., depositing an amorphous silicon P, I, and N films; and, at 300° C.-400° C., depositing P-type and N-type microcrystalline silicon thin-film layers to form the tunnel junction of the thin-film amorphous silicon solar cell.

According to the present invention, the modified polyimide substrate is made by using the molar ratio formula: 3,3'-Trifluoromethyl dimethyl-4,4'-Diaminodiphenylmethane:N,N-Dimethylacetamide:2,3,3',4'-Biphenyl dianhydride= (0.9~1.1):(45~50):(0.9 to 1.1).

Using such substrate, because of the high light transmittance, a conversion efficiency higher than that of solar cells with glass substrate can be obtained.

The advantageous effects of the present invention include: by using the modified polyimide PI substrate, the composition on the surface of the cell can be reduced, high temperature resistance is strengthened. In later stage packaging applications, it can be seen that the photoelectric conversion efficiency and quality-cost ratio of the flexible thin film solar cell is significantly increased.

The followings continue illustrating in detail the fabrication processes and steps of the flexible amorphous silicon solar cell.

1) By a molar ratio of 3,3'-Trifluoromethyl dimethyl-4,4'-Diaminodiphenylmethane:N,N-Dimethylacetamide:2,3,3',4'-Biphenyl dianhydride=(0.9~1.1):(45~50):(0.9 to 1.1) to obtain polyamic acid slurry. After vacuum filtration, a thin film is made on the stainless steel template with a thickness of approximately 0.5 mm by screen printing or spraying. The template, e.g., a template 12 as shown in FIG. 4, has front electrode conductive patterns in the region of which include light-passing through-holes including drainage holes 11' and convergence holes 10'. After being cured and baked dry, a uniform and transparent modified polyimide substrate is formed, the light-passing through-holes on the substrate have the same positions and same functions as those on the template.

2) The modified polyimide substrate is mounted on a substrate frame and is tightened and straightened or leveled.

3) At a temperature of 350° C., depositing transparent conductive SnO2, ITO or ZnO film layer by magnetron sputtering on the modified polyimide substrate.

4) Because there is no film within the through-holes, no laser etching on the transparent conductive film is needed.

5) Cleaning the modified polyimide substrate.

6) Placing the modified polyimide substrate on a deposition holder and push it to a 220° C.-250° C. preheating oven for 1.5-2 hours.

7) Pushing the preheated deposition holder into a vacuum chamber; at a temperature of 220° C.-250° C., depositing amorphous silicon P, I, and N films; and, at a temperature of 300° C., depositing P-type and N-type microcrystalline silicon thin film layers to form tunnel junction(s).

8) Removing the deposition holder from the chamber, taking the substrate frame out of the deposition holder along with the modified polyimide substrate, and cooling the substrate rapidly in an environment at a temperature of 20° C. or below.

9) Laser etching the amorphous silicon films deposited on the modified polyimide substrate to form a channel connecting the positive electrode and the negative electrode of two adjacent cell units.

10) Placing laser etched amorphous silicon films, together with the fixed frame, into an aluminum plating machine to plate an aluminum metal film.

11) Placing the modified polyimide substrate with the plated aluminum metal film, together with the frame, into a laser etching machine to laser etch the metal film at places corresponding to those of the amorphous silicon films.

12) Removing the modified polyimide substrate with the laser etched metal film from the frame to obtain a complete flexible amorphous silicon solar cell.

DETAILED DESCRIPTION OF THE EMBODIMENTS

The principles of the present invention are further illustrated below with the accompanying drawings.

Figure 1:
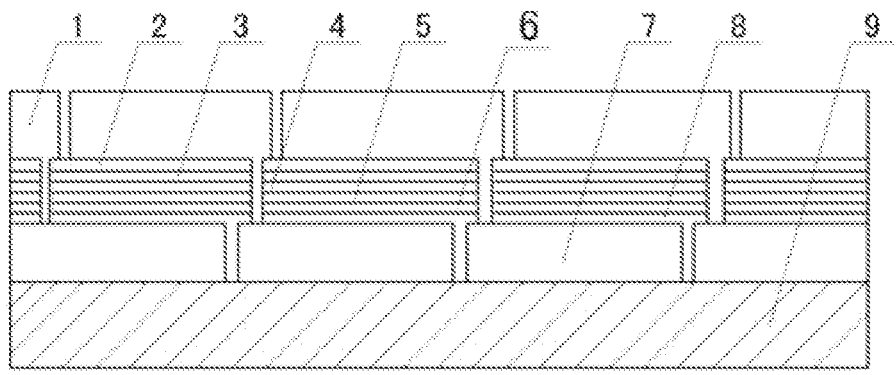
FIG. 1 is a schematic view of a flexible solar cell chip according to the present invention.
Figure 3:
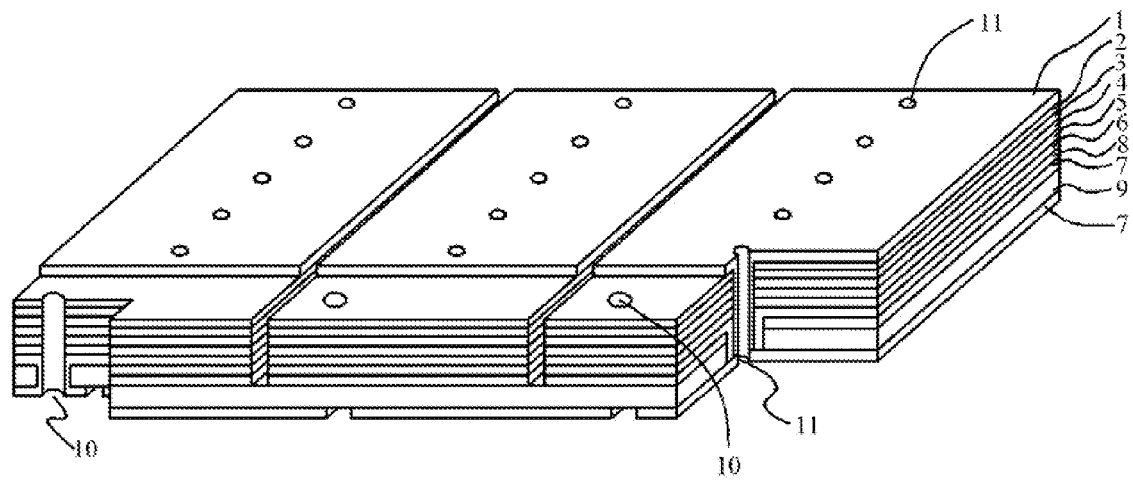
FIG. 3 is a schematic view of another exemplary flexible solar cell chip including through-holes according to the present invention.
Figure 4:
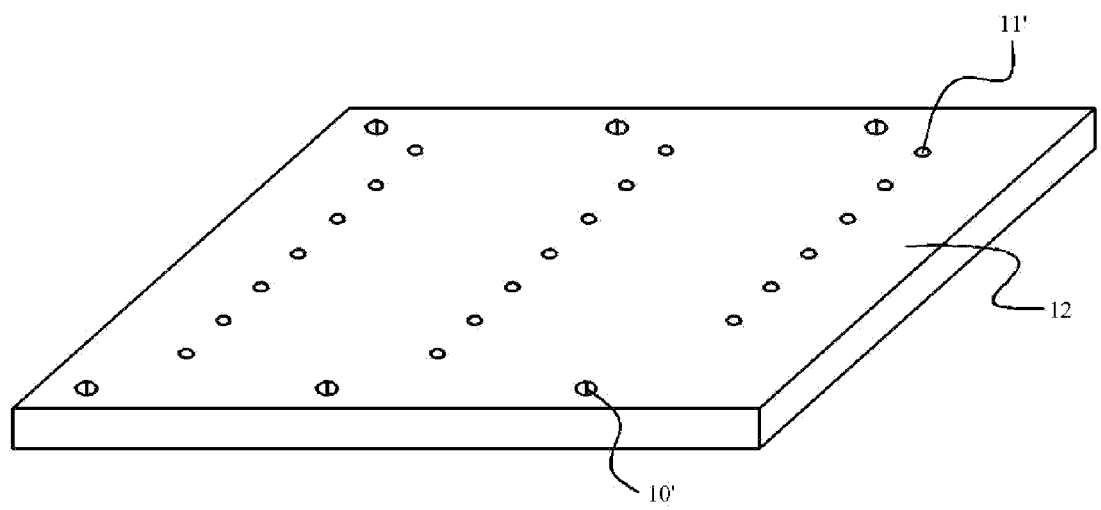
FIG. 4 is a schematic view of a stainless steel template according to the present invention.

FIG. 1 is a schematic view of a flexible solar cell chip according to the present invention. The flexible solar cell chip includes a metal thin film layer 1, N-type amorphous silicon of the bottom cell 2, I-type amorphous silicon of the bottom cell 3, P-type microcrystalline silicon of the bottom cell 4, N-type microcrystalline silicon of the top cell 5, I-type amorphous silicon of the top cell 6, P-type amorphous silicon of the top cell 8, a transparent conductive film 7, and a transparent modified polyimide PI substrate 9. FIG. 3 is a schematic view of another exemplary flexible solar cell chip according to various embodiments. Compared with the exemplary flexible solar cell chip in FIG. 1, FIG. 3 further shows light-passing through-holes, including current-guide holes 11 and convergence holes 10, passing through each of the transparent modified polymer PI substrate 9, the transparent conductive film 7, the PIN-type silicon thin-film stack, and the metal film layer 1.

As shown in FIG. 1, the flexible solar cell is a double-junction stacked amorphous silicon cell structure, using a high-temperature-resistant, transparent, and flexible modified polyimide PI substrate 9 to sequentially form the transparent conductive film 7, the P-type amorphous silicon of the top cell 8, the I-type intrinsic amorphous silicon of the top cell 6, the N-type microcrystalline silicon of the top cell 5, the P-type microcrystalline silicon of the bottom cell 4, the intrinsic amorphous silicon of the bottom cell 3, the N-type amorphous silicon of the bottom cell 2, and the metal thin film layer 1.

Figure 2:
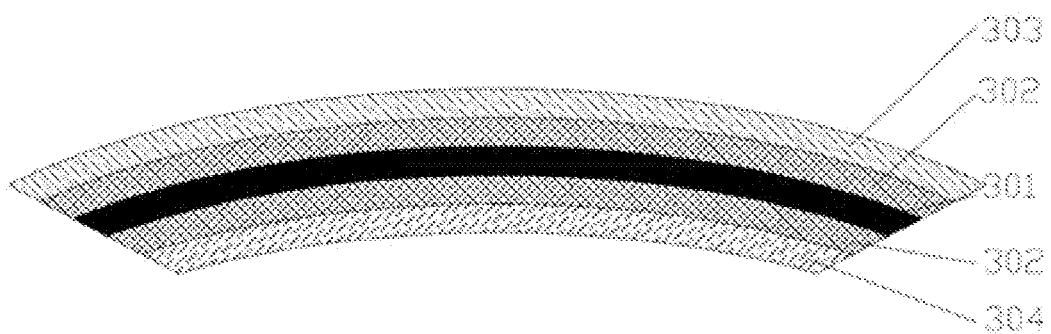
FIG. 2 is a schematic view of a flexible solar cell photovoltaic module according to the present invention.

FIG. 2 is a schematic view of a flexible solar photovoltaic module according to the present invention. The flexible solar photovoltaic module includes light-passing curved glass 303, adhesive 302, a solar cell chip 301, and light-passing curved glass 304. That is, the flexible solar cell chip is packaged by using the light-passing curved glass to form a transparent solar photovoltaic module.

The operation principles according to the present invention are further illustrated below using the above Figures. Traditionally, the fabrication temperature is kept below 200° C., and the transparent conductive film deposited on a flexible substrate often has poor performance. The surface resistance of the transparent conductive film is often high, which is not desired for improving the solar cell conversion efficiency.

According to the present invention, the temperature of the substrate is set to more than 300° C., and high-quality N-type and P-type amorphous silicon is deposited on the modified polyimide substrate to form stacked amorphous silicon cell tunnel junction. Generally, the higher the substrate temperature above 300° C., the larger the energy of atoms deposited on the substrate, and the more likely the atoms break the bound of substrate and move freely on the surface of the substrate to adjust their locations on the substrate and to achieve an optimum state. Thus, defects in the microcrystalline silicon film can be reduced and a high-quality microcrystalline silicon film can be fabricated. Conversely, when the substrate temperature is below 200° C., the fabricated microcrystalline silicon film may have more defects and poor performance.

According to the present invention, a clamping device is used to straighten the PI substrate. The clamping device uses a high-temperature-tolerant rigid material, such that the modified polyimide substrate can be mounted and removed with substantial ease without breaking. Such that the fabrication process of the flexible solar cells can be compatible with the manufacturing process of existing amorphous silicon solar cells with glass substrate. The solar cells can be removed at a higher temperature, shortening the cooling waiting time, and compatible with manufacturing equipment and processes of the amorphous silicon solar cells with glass substrate. No additional production line is required, lowering investment costs of the equipment.

For example, for a completely transparent polymer substrate, the structure of the amorphous silicon solar cell for single junction cells can include: modified transparent PI substrate, a transparent conductive TCO film, P-type amorphous silicon $P^+$ a-Si, intrinsic amorphous silicon I a-Si, N-type amorphous silicon $N^+$ a-Si, and Al metal film, etc.

Embodiment One

A process for fabricating a flexible amorphous silicon solar cell includes the followings.

Providing a stainless steel sheet template of a thickness of approximately 0.5 mm (the template). The template is configured with through-holes distributed within the front electrode pattern region, including one or more current-guide holes (or simply draining holes) and one or more convergence holes.

Formulating a polyamic acid slurry based on a molar ratio.

Screen-printing the polyamic acid paste on the template, and processing it at a high temperature of approximately 350° C. to obtain a uniform and transparent modified polyimide substrate with light-passing through-holes, including the current-guide holes and convergence holes.

At the temperature of approximately 350° C., depositing on the surface of the modified polyimide substrate by magnetron sputtering a transparent ZnO conductive film with a surface-resistance of 15Ω/□ and a light transmittance of 93%. There is no need for laser etching the transparent ZnO conductive film.

Mounting the PI substrate on a deposition holder and moving the deposition holder into a vacuum deposition chamber to deposit, at a temperature of approximately 220° C., the P-type amorphous silicon by approximately 100 Å, the I-type amorphous silicon of the top cell by approximately 900 Å, the I-type amorphous silicon of the bottom cell by approximately 2800 Å, and the N-type amorphous silicon of the bottom cell by approximately 200 Å. Further, at a temperature of approximately 300° C., depositing the N-type microcrystalline silicon thin film layer of the bottom cell by approximately 200 Å and the P-type microcrystalline silicon thin film layer of the top cell by approximately 200 Å to form the tunnel junction.

After removing the deposition holder out of the deposition chamber, the substrate frame and the modified polyimide substrate on the substrate frame are taken from the deposition holder and are rapidly cooled in an environment with a temperature below 20° C.

The amorphous silicon film deposited on the modified polyimide substrate is laser etched to form a channel connecting the adjacent positive electrode and the negative electrode of the cell.

The cell substrate is then placed in an aluminum plating machine to plate an aluminum metal film, and the formed aluminum metal film is laser etched. Thus, a transparent flexible amorphous silicon solar cell or solar cell chip, the core component of the solar photovoltaic module, can be fabricated.

Embodiment Two

A stainless steel sheet template of a thickness of approximately 0.5 mm (the template) is provided. The template is configured with through-holes distributed within the front electrode pattern, including current-guide holes (or simply draining holes) and convergence holes for making the modified PI substrate.

The fabrication steps may be similar to those illustrated in Embodiment one, but the production formula for making modified PI substrate, the deposition temperature for amorphous silicon thin film deposition, and the thickness of various films are changed.

By a molar ratio of 1.0:47:1.0 for 3,3'-Trifluoromethyl dimethyl-4,4'-Diaminodiphenylmethane:N,N-Dimethylacetamide:2,3,3',4'-Biphenyl dianhydride, adding Diamine monomer 3,3'-Trifluoromethyl dimethyl-4,4'-Diaminodiphenylmethane into N,N-Dimethylacetamide DMAc solution, filling with nitrogen, and stirring at room temperature for 5 minutes. Afterwards, 2,3,3',4'-Biphenyl dianhydride a-BPDA is added, under the protection of the filled nitrogen, stirring at room temperature for 20 hours. After vacuum deaeration and filtering, a colorless transparent viscous solution of the polyamic acid is obtained. Coating or spreading the solution on the template or a clean glass plate, and then placing the template or plate in an oven to dry according to the following procedure: 120° C. for 1 hour; 170° C. for 1 hour; 280° C. for 1 hour; 350° C. for 1 hour. After cooling, a uniform transparent modified PI substrate is obtained.

Further, in a vacuum chamber at a temperature of approximately 235° C., depositing the P-type amorphous silicon of the top cell by approximately 120 Å, the I-type amorphous silicon of the top cell by approximately 800 Å, the I-type amorphous silicon of the bottom cell by approximately 3100 Å, and the N-type amorphous silicon of the bottom cell by approximately 150 Å. Further, at a temperature of approximately 350° C., depositing the P-type microcrystalline silicon thin film layer of the bottom cell by approximately 150 Å and the N-type microcrystalline silicon thin film layer of the top cell by approximately 150 Å to form the tunnel junction.

Embodiment Three

In this embodiment, the stainless steel sheet template and the modified substrate are similar to those in Embodiment Two, and the fabrication steps are similar to those in Embodiment One, and the packaging steps are illustrated as follows.

1) Using a transparent flexible front sheet of polymeric film with a thickness of 25 µm~75 µm (e.g., polyvinyl fluoride, fluorinated ethylene propylene copolymer, etc.) and a layer of adhesives with a thickness of 25 µm~75 µm (e.g., EVA, PE, etc.) to form a stacked layer plane.

2) Pressuring tin-coated copper strip to stick on both ends of the solar cell chip.

3) Transferring the solar cell chip attached with the tin-coated strip and the supporting adhesive/transparent flexible polymer film to the hot pressing machine, and at the same time, an adhesive of the thickness of 25 µm~75 µm (e.g., EVA, PE, etc.), and a back sheet of flexible polymer film (a single thin polymer film or multilayer organic-inorganic composite material) with a thickness of 25 µm~75 µm is also provided for hot pressing. According to design requirements of the BIPV module length, wire outlet holes are reserved at positions between the above two layers of materials.

4) The hot-pressed flexible solar cell module can then be cut based on the size of the assembly module, and lead wires are soldered on the wire outlets, wiring boxes are installed, and sealant is filled.

Embodiment Four

A stainless steel template with a thickness of approximately 0.55 mm is used, the fabrication steps for making the flexible amorphous silicon solar cell chip are similar to those in Embodiment One, but with changes in production formula for making the PI substrate and in the deposition temperature for forming the ZnO transparent conductive film.

By a molar ratio of 1.1:50:1.1 for 3,3'-Trifluoromethyl dimethyl-4,4'-Diaminodiphenylmethane:N,N-Dimethylacetamide:2,3,3',4'-Biphenyl dianhydride, adding Diamine monomer 3,3'-Trifluoromethyl dimethyl-4,4'-Diaminodiphenylmethane into N,N-Dimethylacetamide DMAc solution, filling with nitrogen, and stirring at room temperature for 5 minutes. Afterwards, 2,3,3',4'-Biphenyl dianhydride a-BPDA is added, under the protection of the filled nitrogen, stirring at room temperature for 20 hours. After vacuum deaeration and filtering, a colorless transparent viscous solution of the polyamic acid is obtained. Coating or spreading the solution on the stainless steel template, and then placing the template in an oven to dry according to the following procedure: 120° C. for 1 hour; 170° C. for 1 hour; 280° C. for 1 hour; and 350° C. for 1 hour. After cooling, a uniform transparent modified PI substrate is obtained.

At the temperature of approximately 400° C., depositing on the surface of the modified PI substrate by magnetron sputtering a transparent ZnO conductive film with a surface-resistance of 13Ω/□ and a light transmittance of 92%.

Embodiment Five

A stainless steel template with a thickness of approximately 0.55 mm is used, the fabrication steps for making the flexible amorphous silicon solar cell chip with modified PI substrate are similar to those in Embodiment One, but with changes on the deposition temperature for forming the amorphous and microcrystalline silicon thin films in Embodiment One.

Moving the pre-heated deposition holder into a vacuum deposition chamber to deposit, at a temperature of approximately 250° C., the P-type amorphous silicon of the top cell by approximately 70 Å, the I-type amorphous silicon of the top cell by approximately 700 Å, the I-type amorphous silicon of the bottom cell by approximately 3500 Å, and the N-type amorphous silicon of the bottom cell by approximately 250 Å. Further, at a temperature of approximately 350° C., depositing the P-type microcrystalline silicon thin film layer of the bottom cell by approximately 250 Å and the N-type microcrystalline silicon thin film layer of the top cell by approximately 250 Å to form the tunnel junction.

What is claimed is:

1. A flexible solar cell photovoltaic module with a flexible substrate, comprising:
   a silicon series thin-film solar cell chip including: the flexible substrate, a transparent conductive film on the flexible substrate, a PIN-type silicon thin-film stack on the transparent conductive film, and a metal film layer on the PIN-type silicon thin-film stack; and
   packaging materials including a transparent front plate and a transparent rear plate,
   wherein, in the silicon series thin-film solar cell chip:
   the flexible substrate is a transparent modified polymer PI (polyimide) substrate with a substantially high light transmittance, and has light-passing through-holes prefabricated and distributed in a front electrode pattern region of the transparent, modified polymer PI substrate;
   the light-passing through-holes in the transparent, modified polymer PI substrate are one-to-one corresponding to through-holes distributed in a front electrode pattern region of a stainless steel template, and the light-passing through-holes are through each of the transparent modified polymer PI substrate, the transparent conductive film, the PIN-type silicon thin-film stack, and the metal film layer, and are distributed in each of the transparent modified polymer PI substrate, the transparent conductive film, the PIN-type silicon thin-film stack, and the metal film layer; and wherein the flexible solar cell photovoltaic module is formed by placing the silicon series thin-film solar cell chip between the transparent front plate, and the transparent rear plate with affinity and with pressure.

2. The flexible solar cell photovoltaic module with a flexible substrate according to claim 1, wherein:
the stainless steel template is made of a stainless steel sheet or strip with a thickness of 0.45 mm to 0.65 mm with the through-holes distributed in the front electrode pattern region of the stainless steel template.

3. The flexible solar cell photovoltaic module with a flexible substrate according to claim 1, wherein:
the packaging materials include a flexible material and a rigid material;
the rigid material includes at least a transparent glass front plate or a transparent glass rear plate; and
the flexible material includes a transparent flexible polymer front plate and a transparent flexible polymer rear plate.

4. The flexible solar cell photovoltaic module with a flexible substrate according to claim 3, wherein:
the transparent front plate and the transparent rear plate packaging the solar cell chip include at least polyvinyl fluoride and fluorinated ethylene propylene copolymer; and
the packaging materials form a stack including a transparent flexible front sheet of polymeric film with a thickness of 25 µm to 75 µm and a layer of adhesive material with a thickness of 25 µm to 75 µm.

5. The flexible solar cell photovoltaic module with a flexible substrate according to claim 1, wherein:
the PI substrate is made of a transparent modified polyamide material with a light transmittance of 90%-95% and high-temperature resistance of four hours above 350° C. without deformation.

6. A method for fabricating a flexible solar cell photovoltaic module with a flexible substrate, comprising:
preparing a transparent, modified polymer PI (polyimide) substrate;
directly making a silicon series thin-film solar cell chip based on the transparent, modified polymer PI substrate; and
packaging the silicon series thin-film solar cell chip into the flexible solar cell photovoltaic module,
wherein preparing the transparent modified polymer PI substrate includes:
making polyamic acid slurry according to a particular molar ratio;
vacuum filtering the polyamic acid slurry;
screen printing or spaying the polyamic acid slurry on a stainless steel template to form the transparent, modified polymer PI substrate with light-passing through-holes formed simultaneously, wherein the simultaneously-formed light-passing through-holes are distributed in a front electrode region of the transparent, modified polymer PI substrate, and wherein the light-passing through-holes are molded one-to-one corresponding to through-holes distributed in a front electrode pattern region from the stainless steel template;

wherein making the silicon series thin-film solar cell chip includes:
depositing a transparent conductive film on the transparent, modified polymer PI substrate,
depositing at least one single junction PIN structure on the transparent conductive film, the at least one single junction PIN structure including a P-type amorphous silicon film layer, an I intrinsic amorphous silicon layer, and an N-type amorphous silicon film layer, and
depositing a metal film layer on the at least one single junction PIN structure;
wherein the light-passing through-holes are through each of the transparent, modified polymer PI substrate, the transparent conductive film, and various photoelectric conversion layers of the at least one single junction PIN structure; and
wherein packaging the silicon series thin-film solar cell chip includes:
placing the silicon series thin-film solar cell chip between polymer packaging materials including a transparent front plate and a transparent rear plate to press with a pressure into the transparent flexible solar cell photovoltaic module.

7. The method for fabricating a flexible solar cell photovoltaic module with a flexible substrate according to claim 6, wherein:
the stainless steel template is made of a stainless steel sheet or strip with a thickness of 0.45 mm to 0.65 mm with the through-holes distributed in the front electrode pattern region of the stainless steel template.

8. The method for fabricating a flexible solar cell photovoltaic module with a flexible substrate according to claim 6, wherein:
the transparent conductive film includes a transparent conductive $SnO_2$, ITO or ZnO film on a top surface and a back surface of the transparent modified polyimide PI substrate.

9. The method for fabricating a flexible solar cell photovoltaic module with a flexible substrate according to claim 6, wherein the solar cell chip is a double-junction solar cell fabricated by:
on the transparent modified polymer PI substrate and in a vacuum chamber, at a temperature of approximately 250° C., depositing amorphous silicon thin film layers of a P-type film layer of a top cell of approximately 120 Å, and an I-type film layer of the top cell of approximately 910 Å;
at a temperature of approximately 400° C., depositing an N-type amorphous silicon thin film of the top cell of approximately 250 Å and a P-type microcrystalline silicon thin film layer of a bottom cell of approximately 250 Å to form a tunnel junction; and
at a temperature of approximately 400° C., depositing an I-type amorphous silicon film of the bottom cell of approximately 3500 Å and an N-type amorphous silicon film layer of the bottom cell of approximately 250 Å to form the flexible solar cell chip.

10. The method for fabricating a flexible solar cell photovoltaic module with a flexible substrate according to claim 9, wherein packaging the solar cell chip includes:
packaging the silicon series thin-film solar cell chip between organic or inorganic materials of the transparent front plate and the transparent rear plate by laminating pressing or a high-pressure autoclave to form the transparent flexible solar cell photovoltaic module.

11. The method for fabricating a flexible solar cell photovoltaic module with a flexible substrate according to claim 10, wherein packaging the solar cell chip includes:
   cutting the packaged solar cell chip;
   soldering lead wires;
   installing a junction box; and
   filling in sealant.

12. The flexible solar cell photovoltaic module with a flexible substrate according to claim 1, wherein the light-passing through-holes and functions thereof in the transparent, modified polyimide PI substrate are same as the through-holes and functions thereof in the stainless steel template.

13. The flexible solar cell photovoltaic module with a flexible substrate according to claim 1, wherein the flexible solar cell photovoltaic module further includes:
   a first layer of adhesive material between the transparent front plate and the silicon series thin-film solar cell chip; and
   a second layer of adhesive material between the silicon series thin-film solar cell chip and the transparent rear plate.

14. The flexible solar cell photovoltaic module with a flexible substrate according to claim 1, wherein the transparent conductive film includes a transparent conductive $SnO_2$, ITO or ZnO film on both a top surface and a back surface of the transparent, modified polyimide PI substrate.

15. The method for fabricating a flexible solar cell photovoltaic module with a flexible substrate according to claim 6, wherein preparing the transparent, modified polymer PI substrate includes preparing the light-passing through-holes and the transparent, modified polymer PI substrate simultaneously in a single process.

16. The method for fabricating a flexible solar cell photovoltaic module with a flexible substrate according to claim 8, wherein depositing the transparent conductive film on the transparent, modified polymer PI substrate includes a magnetron sputtering process to simultaneously form the transparent conductive film and through-holes in the transparent conductive film.

* * * * *